(12) United States Patent
Harenza et al.

(10) Patent No.: US 6,351,719 B1
(45) Date of Patent: Feb. 26, 2002

(54) SHARED SLOT PCI/ISA BUS EXTENDER

(75) Inventors: Patrick J. Harenza, Crystal Lake; Gregory R. Amidon, Hanover Park, both of IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/321,959

(22) Filed: May 28, 1999

(51) Int. Cl.[7] .............................................. G01R 27/28
(52) U.S. Cl. ........................ 702/118; 702/118; 702/119; 710/260
(58) Field of Search ................................ 702/118, 119, 702/117; 710/260; 29/830; 326/81; 361/770

(56) References Cited

U.S. PATENT DOCUMENTS

| | | | | |
|---|---|---|---|---|
| 5,255,159 A | * | 10/1993 | Seyk ........................... | 361/770 |
| 6,028,450 A | * | 2/2000 | Nance ........................... | 326/81 |
| 6,049,973 A | * | 4/2000 | Frank, Jr. et al. ............. | 29/830 |
| 6,112,273 A | * | 8/2000 | Kau et al. ..................... | 710/260 |

* cited by examiner

*Primary Examiner*—Arthur T. Grimley
*Assistant Examiner*—Mohamed Charioui
(74) *Attorney, Agent, or Firm*—Baniak Pine & Gannon

(57) ABSTRACT

A shared slot PCI/ISA bus extender apparatus includes an ISA Card, a PCI Card, and first, second and third standoffs. The ISA Card includes a digital input/output device. The PCI Card is electronically connected to the ISA Card. The first, second and third standoffs are positioned between the two Cards to join the two Cards together. The bus extender apparatus may then be inserted into a shared slot on a motherboard, and be used simultaneously.

20 Claims, 3 Drawing Sheets

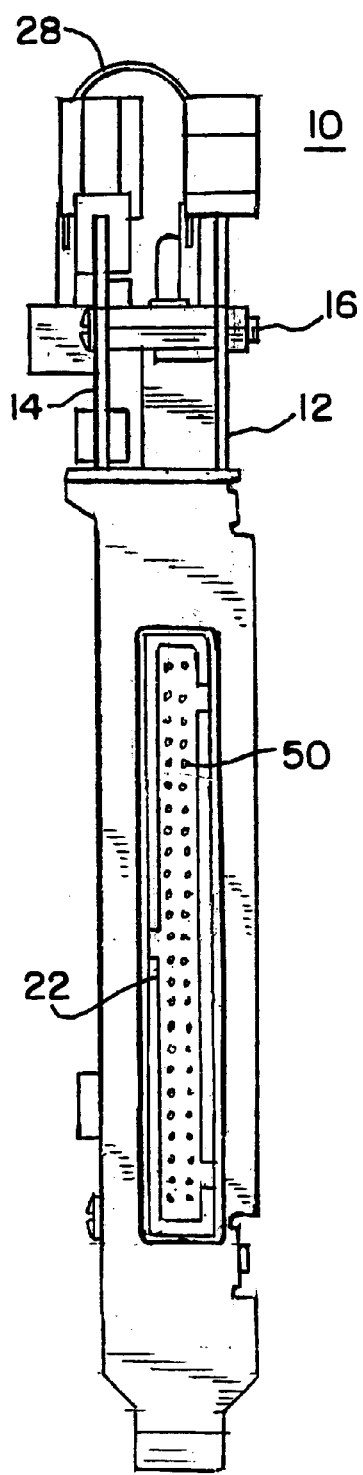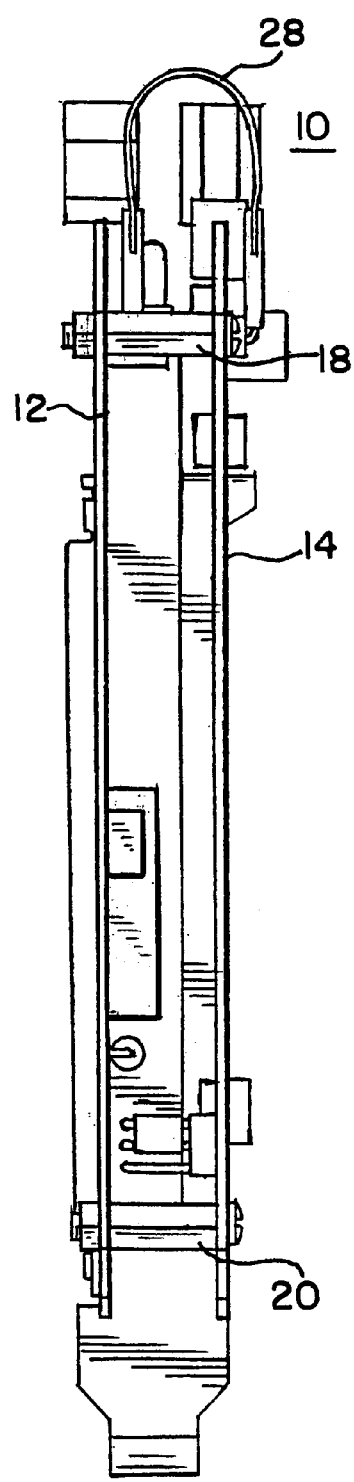

SHARED SLOT PCI/ISA BUS EXTENDER

FIELD OF THE INVENTION

This invention relates to PCI and ISA Cards, and, in particular, to a combined PCI/ISA Card having the ability to utilize a shared slot within a motherboard for the purposes of simultaneously accessing both the PCI and the ISA Cards.

BACKGROUND OF THE INVENTION

Like all aspects of computers, motherboards are also under severe space limitations and restrictions. One area in which motherboards are subject to space limitations is in regards to slots for receiving PCI (Peripheral Compoent Interconnect) Cards and ISA (Industry Standard Architecture) Cards. In such instances, the slots for receiving the PCI Cards are positioned extremely close to the slots for receiving ISA Cards. As a result of such space limitations, in some instances, usage of the PCI and ISA Cards is an alternative choice, i.e., the user/programmer has the option of utilizing one Card or the other, and cannot utilize both Cards simultaneously. Thus, the use of shared slots within a computer motherboard is not quite an accurate statement, as it consists of using either a PCI or an ISA Card, disposed within one slot. A design allowing for the insertion of both a PCI Card and an ISA Card within a computer motherboard would conversely allow the user/programmer to access both the PCI and ISA Cards simultaneously.

Accordingly, it would be desirable to provide a shared slot PCI/ISA bus extender that allows for the insertion and simultaneous access of a PCI Card and an ISA Card within a computer motherboard.

SUMMARY OF THE INVENTION

One aspect of the invention provides a shared slot PCI/ISA bus extender apparatus. The bus extender apparatus includes an ISA Card, a PCI Card, and first, second and third standoffs. Preferably, both Cards include an overcurrent circuit. The bus extender apparatus may include first, second, third and fourth corner regions. The ISA Card includes a digital input/output device, which may include 48 digital input/output lines. The PCI Card is electronically connected to the ISA Card, preferably by means of a cable. The first, second and third standoffs are positioned between the two Cards to join the two Cards together. Preferably, the standoffs each include a screw portion, a bolt portion and a 0.500 inch spacer portion. The first standoff may be positioned at the first corner region of the bus extender apparatus, with the second and third standoffs being positioned at the second and third corner regions, respectively. The bus extender apparatus may then be inserted into a shared slot on a motherboard, and be used simultaneously.

A further aspect of the invention provides a method of operation of a shared slot PCI/ISA bus extender apparatus. The method provides an ISA Card, a PCI Card, and first, second and third standoffs. The bus extender apparatus may include first, second, third and fourth corner regions. The ISA Card includes a digital input/output device. The PCI Card is electronically connected to the ISA Card, preferably by means of a cable. The first, second and third standoffs are positioned between the two Cards. Preferably, the standoffs each include a screw portion, a bolt portion and a 0.500 inch spacer portion. The bus extender apparatus is inserted into a shared slot on a motherboard. Signals are transmitted through the digital input/output device to access the ISA Card and the PCI Card simultaneously. Signals may be transmitted through the digital input/output device to access each of the ISA Card and the PCI Card simultaneously. The first, second and third standoffs may be positioned at the first, second and third corner regions, respectively. Each of the spacer portions may be positioned between the ISA Card and the PCI Card of the bus extender apparatus. Each of the screw portions may be positioned on a first side of the bus extender apparatus. Each of the bolt portions may be positioned on a second side of the bus extender apparatus.

A further aspect of the invention provides a system for testing an electronic device. The system includes a motherboard and a shared slot PCI/ISA bus extender apparatus. The bus extender apparatus includes a plurality of ISA female receptors and a plurality of PCI female receptors. One of the ISA and PCI female receptors are positioned together to form a shared slot. The shared slot PCI/ISA bus extender apparatus includes an ISA Card, a PCI Card, and first, second and third standoffs. The ISA Card includes a digital input/output device and a male connector. The PCI Card is electronically connected to the ISA Card, and includes a male connector. The first, second and third standoffs are positioned between the Cards. Signals may be transmitted through the digital input/output device to access the ISA Card and the PCI Card simultaneously.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and the equivalents thereof.

BRIEF DESCRIPTION OF THE DRAWINGS

FIG. 4 is a rear view of FIG. 2; and

FIG. 5 is a bottom view of FIG. 2.

DETAILED DESCRIPTION OF THE PRESENTLY PREFERRED EMBODIMENTS

Figure 1:
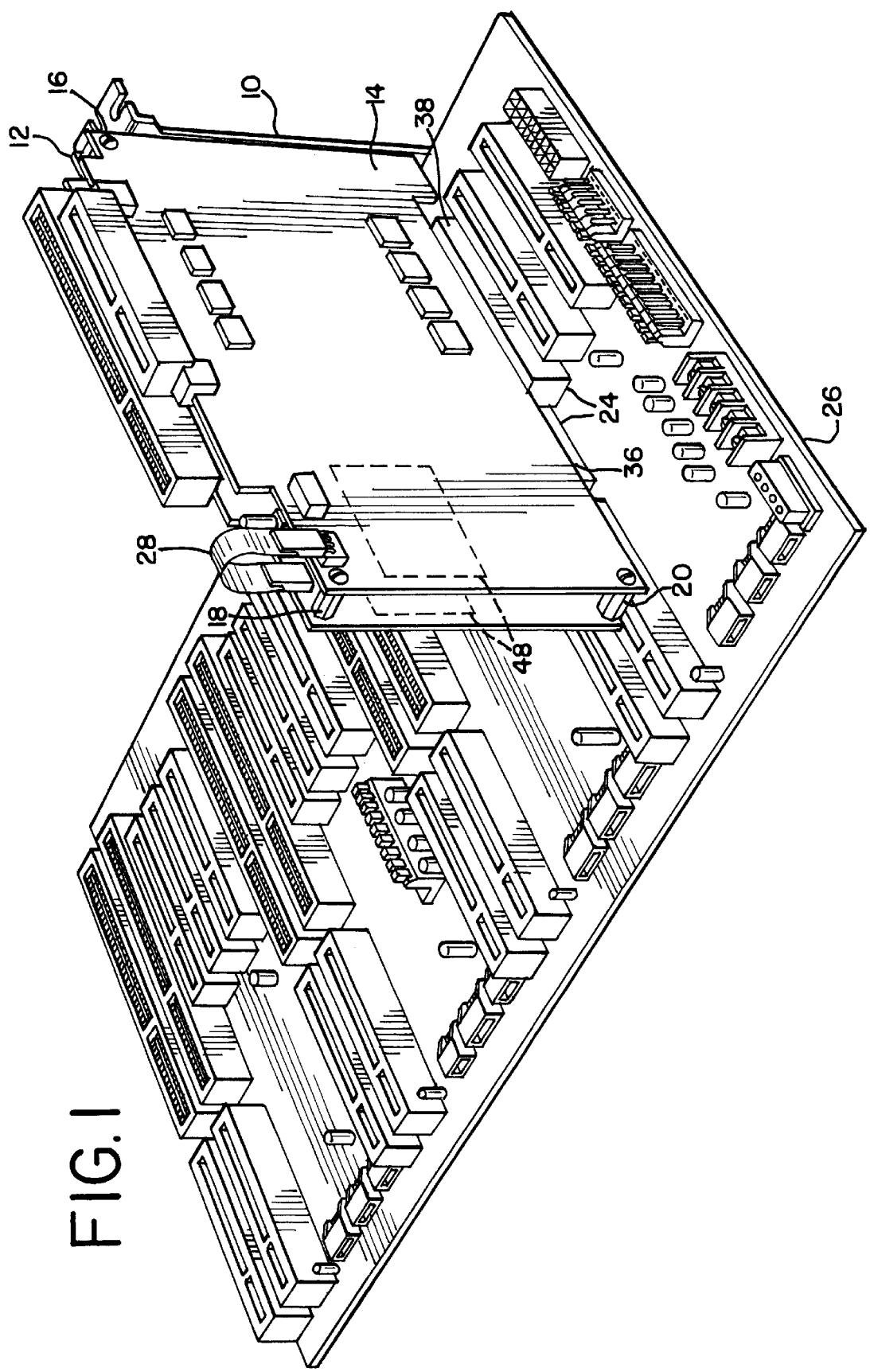
FIG. 1 is a perspective view of a preferred embodiment of a shared slot PCI/ISA bus extender, made in accordance with the invention.

Referring to FIGS. 1–5, reference numeral 10 represents a shared slot PCI/ISA bus extender apparatus. The bus extender apparatus 10 includes an ISA Card 12, a PCI Card 14, and first, second and third standoffs 16, 18, 20. The ISA Card 12 includes a digital input/output device 22. The PCI Card 14 is operably electronically connected to the ISA Card 12. The standoffs 16, 18, 20 are positioned between the ISA Card 12 and the PCI Card 14, and are used to operably join the ISA Card 12 and the PCI Card 14. The bus extender apparatus 10 is inserted into a shared slot 24 on a motherboard 26. Doing so allows a user/programmer to simultaneously access and utilize both the ISA Card 12 and the PCI Card 14 by transmitting signals through the digital input/output device 22 to the Cards 12, 14.

The ISA Card 12 is preferably a standard bus switch, and may, for example, be a standard ISA card available from 3COM Corp. Preferably, the ISA Card 12 is controlled by a standard digital input/output device 22, such as, for example, a DIO (Digital Input/Output) connector. The PCI Card 14 is also preferably a standard bus switch, and may, for example, be a standard PCI Card available from 3COM Corp. Also shown, in phantom, on the Cards 12, 14 themselves, are overcurrent circuits 48. Preferably, these circuits 48 are used, in a manner similar to surge protector devices, to prevent damage to the host computer from current surges and short circuits during the testing of various peripheral devices, such as, for example, modems, video cards and audio cards. Preferably, both Cards 12, 14 also possess the ability to enable the user/programmer to remove and replace the various peripheral devices without having to power cycle the host computer. Finally, both Cards 12, 14 include male connectors 52, 54, which are used to position the bus extender 10 within the shared slot 24.

Each of the standoffs 16, 18, 20 consists of a screw portion 30, a bolt portion 32 and a spacer portion 34. Preferably, the spacer portions 34 possess a length of 0.500 inches. This allows the bus extender apparatus 10 to be inserted within the shared slot 24, as the length is proportionate with the distance between the ISA female receptor 36 and the PCI female receptor 38 of the shared slot 24. Additionally, the spacer portions 34 may, for example, have a hexagonal cross-section. However, the spacer portions 34 may be formed of any similar cross-sectional shape.

Each standoff 16, 18, 20 is placed at one of four corner regions 40, 42, 44, 46 of the bus extender apparatus 10. Preferably, the first standoff 16 is placed at the first corner region 40, and so on. One of the corner regions 40, 42, 44, 46 is preferably left open and away from the standoffs 16, 18, 20, as the digital input/output device 22 prevents a standoff 16, 18, 20 from being positioned therein. The standoffs 16, 18, 20 are positioned such that the spacer portions 34 are placed in the middle of the bus extender apparatus 10, and the bolt portions 32 and the screw portions 30 are placed on opposing sides of the bus extender apparatus 10.

Figure 2:
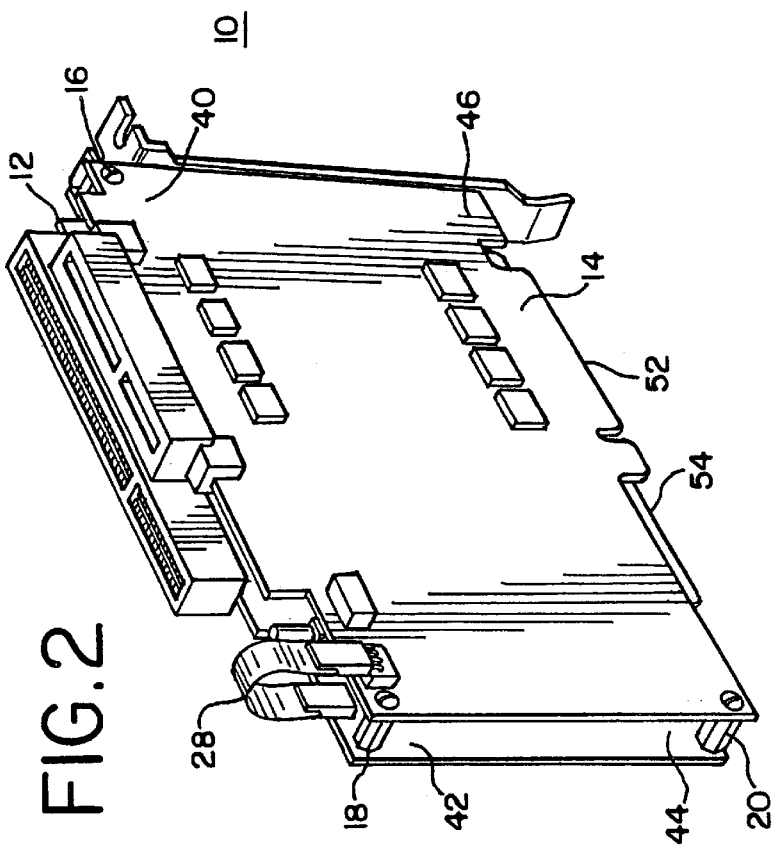
FIG. 2 is a perspective view of a preferred embodiment of a bus extender apparatus, made in accordance with the invention.
Figure 3:
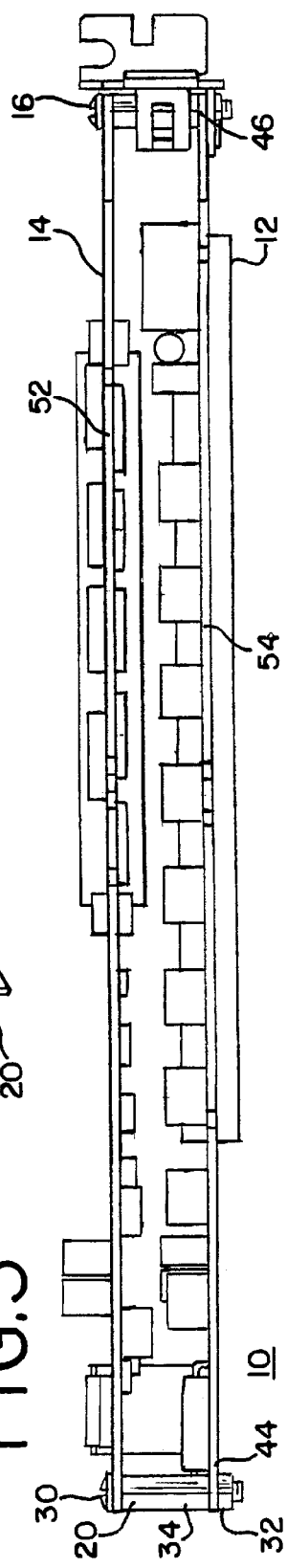
FIG. 3 is a front view of FIG. 2.

As shown in FIG. 2, the motherboard 26 is preferably a standard motherboard used in many computers and electronic devices. It comprises a plurality of ISA female receptors 36 and a plurality of PCI female receptors 38. One of the ISA female receptors 36 and one of the PCI female receptors 38 are positioned in such a way as to form the shared slot 24.

Also shown is an electronic ribbon-type cable 28. Preferably, the cable 28 is used to electronically couple the ISA Card 12 and the PCI Card 14 together. The cable 28 allows electronic signals, transmitted to the ISA Card 12 by means of the digital input/output device 22, to be furthered on to the PCI Card 14. Additionally, the digital input/output device 22, positioned on the ISA Card 12, is shown as containing 48 digital input/output lines 50.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A shared slot PCI/ISA bus extender apparatus, comprising:
   an ISA Card;
   a PCI Card operably electronically connected to the ISA Card; and
   a digital input/output device mounted on the ISA card usable by both the ISA and PCI cards through the electronic connection;
   first, second and third standoffs positioned between the ISA Card and the PCI Card to operably join the ISA Card and the PCI Card;
   wherein the bus extender may be inserted into a shared slot on a motherboard and each of the ISA Card and the PCI Card may be used simultaneously.

2. The bus extender apparatus of claim 1, wherein a cable is coupled between the ISA Card and the PCI Card to provide the electronic connection therebetween.

3. The bus extender apparatus of claim 2, wherein the bus extender apparatus further includes first, second, third and fourth corner regions.

4. The bus extender apparatus of claim 3, wherein the first standoff is positioned at the first corner region of the bus extender apparatus.

5. The bus extender apparatus of claim 4, wherein the second standoff is positioned at the second corner region of the bus extender apparatus.

6. The bus extender apparatus of claim 5, wherein the third standoff is positioned at the third corner region of the bus extender apparatus.

7. The bus extender apparatus of claim 6, wherein each of the first, second and third standoffs include a screw portion, a bolt portion and a spacer portion.

8. The bus extender apparatus of claim 7, wherein each of the spacer portions includes a hexagonal cross-section.

9. The bus extender apparatus of claim 8, wherein each of the spacer portions is 0.500 inches long.

10. The bus extender apparatus of claim 9, wherein each of the ISA Card and the PCI Card includes an overcurrent circuit.

11. The bus extender apparatus of claim 10, wherein the digital input/output device includes 48 digital input/output lines.

12. A method of operation of a shared slot PCI/ISA bus extender apparatus, the method comprising the steps of providing an ISA Card, a PCI Card operably electronically connected to the ISA Card, a digital input/output device usable by both the ISA and the PCI cards, and first, second and third standoffs positioned between the ISA Card and the PCI Card, to operably join the ISA and PCI cards;
   inserting the bus extender into a shared slot on a motherboard; and
   transmitting signals through the digital input/output device to access each of the ISA Card and the PCI Card simultaneously.

13. The method of claim 12, further providing a cable coupled between the ISA Card and the PCI Card; and further including the steps of
   transmitting signals through the digital input/output device, and
   transmitting signals through the cable to access each of the ISA Card and the PCI Card simultaneously.

14. The method of claim 13, further providing first, second, third and fourth corner regions disposed within the bus extender apparatus; and further including the step of
   operably positioning the first standoff at the first corner region.

15. The method of claim 14, further including the step of operably positioning the second standoff at the second corner region.

16. The method of claim 15, further including the step of operably positioning the third standoff at the third corner region.

17. The method of claim 16, wherein each of the first, second and third standoffs include a screw portion, a bolt portion and a spacer portion, each of the spacer portions being hexagonal in shape and 0.500 inches in length; and further including the step of positioning each of the spacer portions between the ISA Card and the PCI Card of the bus extender apparatus.

18. The method of claim 17, further including the step of positioning each of the screw portions on a first side of the bus extender apparatus.

19. The method of claim 18, further including the step of positioning each of the bolt portions on a second side of the bus extender apparatus.

20. A system for testing an electronic device, comprising:

a motherboard including a plurality of ISA female receptors and a plurality of PCI female receptors, one of each of the ISA and PCI female receptors positioned to form a shared slot;

a shared slot PCI/ISA bus extender apparatus including an ISA Card including a male connector, a PCI Card operably electronically connected to the ISA Card and including a male connector, a digital input/output device attached to the ISA card and usable by both the ISA and PCI cards through the electronic connection, and first, second and third standoffs positioned between the ISA Card and the PCI Card to operably join the ISA Card and the PCI Card, each of the ISA Card and PCI Card male connectors positioned in the shared slot;

wherein signals may be transmitted through the digital input/output device to access the ISA Card and the PCI Card simultaneously.

* * * * *